United States Patent [19]

DesJardin et al.

[11] Patent Number: 4,951,053
[45] Date of Patent: Aug. 21, 1990

[54] METHOD AND APPARATUS FOR SWITCHING CURRENTS INTO THE SUMMING NODE OF AN INTEGRATING ANALOG-TO-DIGITAL CONVERTER

[75] Inventors: Lawrence A. DesJardin, Longmont; Wayne C. Goeke, Fort Collins, both of Colo.

[73] Assignee: Hewlett-Packard Company, Palo Alto, Calif.

[21] Appl. No.: 304,741

[22] Filed: Jan. 31, 1989

[51] Int. Cl.⁵ .............................................. H03M 1/12
[52] U.S. Cl. .................................. 341/136; 341/135; 341/155; 341/172
[58] Field of Search ............... 341/129, 135, 136, 168, 341/155, 172

[56] References Cited

U.S. PATENT DOCUMENTS

| | | | |
|---|---|---|---|
| 3,818,246 | 6/1974 | Hellwarth et al. | 341/168 |
| 3,918,050 | 11/1975 | Dorsman | 341/158 |
| 4,112,428 | 9/1978 | Dorsman | 341/158 |
| 4,357,600 | 11/1982 | Ressmeyer et al. | 341/129 |
| 4,574,271 | 3/1986 | Yada | 341/168 |
| 4,598,270 | 7/1986 | Shutt et al. | 341/166 |
| 4,745,395 | 5/1988 | Robinson | 341/135 |
| 4,876,544 | 10/1989 | Kuraishi | 341/155 |

Primary Examiner—William M. Shoop, Jr.
Assistant Examiner—Gary J. Romano
Attorney, Agent, or Firm—Edward L. Miller

[57] ABSTRACT

An arrangement of switches and resistors for switching current into the summing node of an integrator uses a pair of switches for each resistor. Each resistor is connected at one end to a reference voltage. The other end of the resistor is connected to a first switch, which is in turn connected to the summing node. A second switch is connected between ground and the junction of the resistor and the first switch. One or the other of the two switches will always be on. When the first switch is on and the second one is off a current will flow from the reference voltage, through the resistor and into the summing node. When the first switch is off and the second one is on essentially the same current will flow from the reference voltage, through the resistor and into ground. The current will be nearly the same, since the virtual ground of the integrator approximates actual ground. This stabilizes the value of the reistor by keeping the power dissipation therein almost exactly constant, and elminates load induced fluctuations in the reference voltage. It also allows each resistor to be disconnected from the summing node, by turning each associated first switch off and each associated second switch on. Under these circumstances no appreciable current from the resistors flows into the summing junction, by virtue of the switches themselves, and without resort to precision cancellation of opposing currents, as in some prior art switching schemes. This feature allows the connection of multiple instances of switched resistor networks to the summing node. One network switched resistors can be put to use while all the others are disconnected.

10 Claims, 2 Drawing Sheets

1

METHOD AND APPARATUS FOR SWITCHING CURRENTS INTO THE SUMMING NODE OF AN INTEGRATING ANALOG-TO-DIGITAL CONVERTER

REFERENCE TO RELATED PATENT

The subject matter of this application is related to that disclosed in U.S. Pat. No. 4,357,600 entitled MULTISLOPE CONVERTER AND CONVERSION TECHNIQUE, which issued on Nov. 2, 1982 to Ressmeyer et al., and is assigned, as is the present application, to Hewlett-Packard Co. of Palo Alto, Calif. U.S. Pat. No. 4,357,600, which is hereinafter variously referred to as the Ressmeyer or Multislope Patent, is hereby expressly incorporated by reference.

BACKGROUND AND SUMMARY OF THE INVENTION

The reader is urged to obtain a copy of the Ressmeyer Patent, as it describes what heretofore was probably *the* state of the art in integrating analog-to-digital converters, and further because this disclosure describes an improvement thereto. The improvement is the replacement in the Ressmeyer Patent of a particular switching circuit configuration with a superior one. The major aspects of the multislope technique remain unchanged, and need not be repeated herein. Essentially, we disclose a way to modify Ressmeyer to obtain superior performance. In the interests of brevity we do not repeat at length material that is already disclosed in Ressmeyer.

The technique of multislope integration for analog-to-digital conversion is well described in Ressmeyer. Refer now to FIG. 3 of Ressmeyer; the technique shown at 35 for switching currents to charge and discharge the integrator may be termed "reference voltage switching," since the switching elements are located between the reference voltage and the resistors that determine the value of the current.

According to the Multislope Patent resistor 319, and the pairs of resistors 327 and 328 with their associated switches, are used during a run-up interval to keep the output voltage of the integrator within certain first limits while the input voltage to be measured is applied to summing junction 34 through switch 32 and resistor 33. This is possible because, by design, the current $I_d$ available from resistors 319, 327 and 328 in switching network 35 exceeds the input current $I_i$. After the run-up interval the input voltage is removed, and the combination of resistors 319, 327 and 328 may be used one last time in a prerun-down interval to further reduce the integrator output voltage to one that is of a particular polarity and that is within certain second limits that are closer together than the first limits. Following this there is a run-down interval during which resistors 329–331 and their associated switches are used to exhaust all remaining charge on the integrator. Throughout the entire process a record is kept of what amounts of switched current $I_d$ were applied to the integrator, and for how long, from which the applied voltage can be computed.

Although reference voltage switching works well, there are several effects that combine to limit its attainable accuracy and linearity. First, resistors 327 through 331 do not experience a constant voltage drop. For example, resistor 327 drops nearly minus twelve volts when switch 322 is in one position, but no voltage at all when that switch is in the other position. This gives rise to non-constant self-heating that causes corresponding changes in the value of the resistor, which in turn alters the current applied to the summing node. The effect is to introduce some amount of uncertainty concerning the amount of charge transferred to or from the integrator.

Second, there is no way to disconnect the run-up and prerun-down current switching mechanism from the summing node. Note that to apply a current of zero to the summing node, one of switches 322 and 323 is closed. The idea is that with equal reference voltages (320, 321) resistor 319 can be adjusted to produce a net current of zero into the summing node 34. But summing node 34 is not at exactly zero volts; it operates at the offset voltage of the integrator, which can drift over time and as a function of temperature. Which one of resistors 327 and 328 is used to produce the net zero current also introduces uncertainty, since they are not identical. And for various good reasons, each of those resistors is used in alternation for this purpose. The upshot of the last several sentences is that a net zero current is *not* immediately obtained, and that yet another compensatory mechanism is required: the sample and hold circuit 311. Its purpose is to adjust the offset voltage of the integrator to move the summing node 34 so that, for a given measurement, a satisfactory net zero current is possible. According to those who have good reason to know, that method of ensuring a net zero current is a source of considerable aggravation.

A third disadvantage of the reference voltage switching scheme shown in FIG. 3 of Ressmeyer is that only one current value is available for use during run-up. In Ressmeyer that current is a plus or minus value that is slightly larger than the plus or minus maximum input current that flows through the input resistor $R_i$ 33. If the amount of current used during run-up were selectable it would then be possible to offer the user of the converter a choice concerning the trade-off between speed of measurement and resolution. One might contemplate adding a Ressmeyer additional switches and resistors to achieve this, but there are formidable problems in trying to keep the net contributed current zero for the various combinations. The problem is that, with the reference voltage switching scheme of Ressmeyer, obtaining a net contributed current of zero after run-up (so that run-down may proceed) requires symmetry and the exact counterbalancing of a great many parameters, many of which do not track each other either over time or with temperature. Adding additional switching networks would place an even greater burden on the sample and hold circuit.

These disadvantages may be avoided and other advantages realized by the use of another switching arrangement, which we shall call summing node switching. In this arrangement the resistors are permanently connected at one end to their reference voltage, and to a pair of switches at the other. One of the switches connects to ground, and the other to the summing node. For each pair of such switches, only one of the switches may be closed at any given time. Thus, the current through the resistor is essentially constant, since the voltage at the summing node is a virtual ground almost equal to actual ground. It will be appreciated that the combination of the reference voltage resistor amounts to a constant current source whose current flow is routed to differing destinations by the pair of switches.

It will be understood by those skilled in the art that other current sources may be used in place of the constant voltage source and the resistor.

As will become clear, this switching scheme need not rely upon the exact counteraction of superimposed currents to produce a net contributed current of zero to the summing node. Instead, the resistors are actually *disconnected* from the summing node, and others can be connected, allowing the use of different current values during run-ups. As a further benefit, the sample and hold circuit may be eliminated, since the integrator offset no longer influences the achievement (during run-down) by the run-up switching network of the zero contributed current condition.

DESCRIPTION OF A PREFERRED EMBODIMENT

Figure 1:
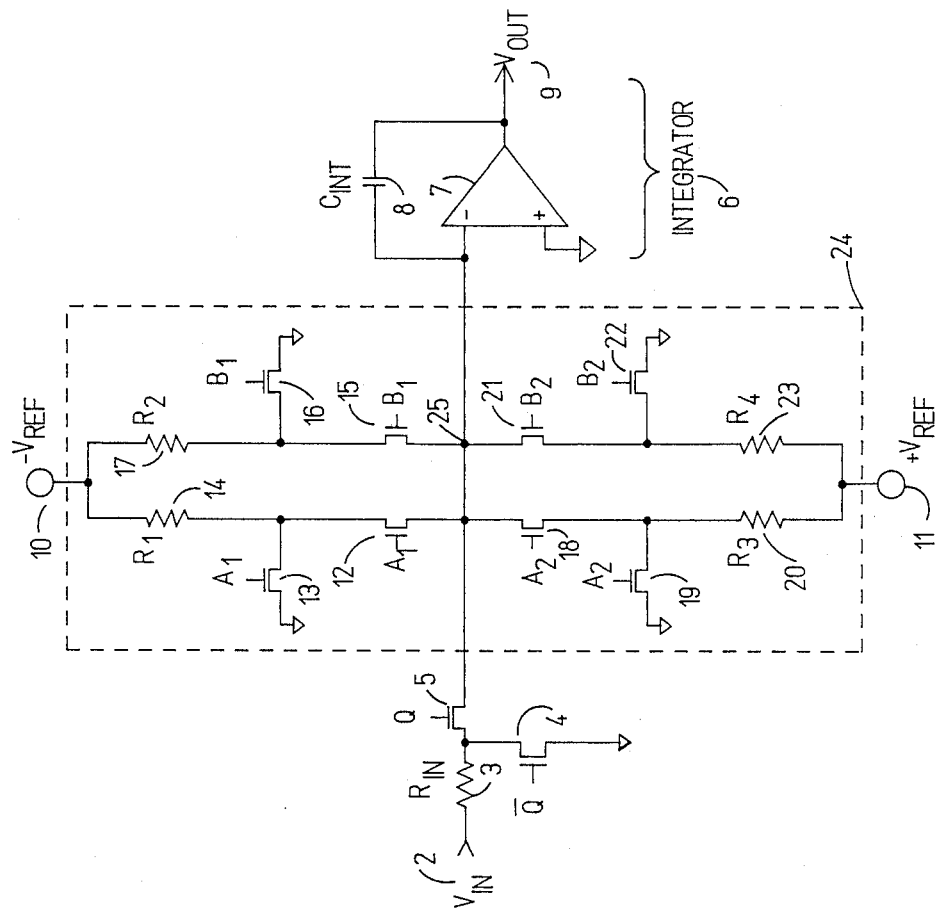
FIG. 1 is a schematic diagram of an arrangement of switches and resistors for controlling the application of current to the summing junction of an integrator.

Refer now to our FIG. 1 herein, which is a schematic generally similar in scope and level of abstraction to FIG. 3 in Ressmeyer. Aside from the particular differences about how the switching is done (FIG. 3 in Ressmeyer is reference voltage switching, while the preferred embodiment shown in our FIG. 1 is summing node switching) there are certain other differences and similarities that we wish to point out. To begin with, note that input terminal 2 in our FIG. 1 corresponds to Ressmeyer's 30. In like fashion, our $R_{in}$ 3 corresponds his $R_i$ 33. Our FET switches 4 and 5 correspond to his switch 32. Our summing node 25 corresponds to his summing node 34. Our integrator 6 corresponds to his integrator 36. Our integrator output voltage $V_{out}$ 9 corresponds to his $V_{out}$ from his integrator 36. Our summing node switching network 24 performs the same general function as does a portion of his network 35, although its internal operation is different. It will be understood that much of the remaining circuitry in Ressmeyer's FIG. 3 is also present in one form or another in an actual apparatus constructed after the fashion of our FIG. 1, although the exact nature of such circuitry is a matter of design choice and is outside the scope of our present interest.

One difference in scope between our FIG. 1 and Ressmeyer's FIG. 3 is that his switching network 35 includes all switches and resistors necessary for run-up, prerun-down, and run-down. A more limited version of his switching network 35 appears as 35' in his FIG. 6, associated with which is his FIG. 7 describing the switch states needed for each function. Of particular interest in FIG. 7 is the demonstration of equal numbers of transistions in each of the switches, which helps to eliminate error owing to certain imperfections in the switches. Our summing node switching preserves and improves upon this error reduction scheme. The switching network 35' of Ressmeyer's FIG. 6 is for use only during run-up and prerun-down. Resistors 329–331 and their associates switches 324–326 are omitted, as these pertain to exhausting the remaining integrator charge during run-down. Switching network 24 of our FIG. 1 corresponds to switching network 35' of Ressmeyer's FIG. 6. It will be understood by those skilled in art that an additional switching network of some sort is also connected to our summing node 25 to effect the final run-down. In a preferred embodiment this is accomplished with a precision current mode DAC used as a constant current source, although it could also be another switching network very similar in topology to our switching network 24 itself. The run-down switching network has been omitted from our FIG. 1 for the sake of brevity.

Also, it will be noted that although our integrator 6 comprises an operational amplifier 7 with differential inputs and a capacitor 8, just as Ressmeyer's integrator 36 includes an operational amplifier 37 with differential inputs and capacitor 38, one input of his amplifier 37 receives one of its differential inputs from a sample and hold circuit 311. There is no such corresponding circuit needed when our switching network 24 is used. The corresponding differential input for our amplifier 7 is simply connected to ground.

Finally, all things being otherwise equal, the resistance values used for summing node switching are twice the value of those used in reference voltage switching. Resistors 319, 327 and 328 in Ressmeyer are all very nearly the same value. Likewise, resistors $R_1$ 14, $R_2$ 17, $R_3$ 20 and $R_4$ 23 in our FIG. 1 are also all equal in value to each other. However, for a given value of run-up current to be supplied from a given reference voltage, our resistors $R_1$–$R_4$ are each *twice* the value of Ressmeyers resistors 319, 327 and 328.

The operation of switching network 24 in our FIG. 1 is as follows. Assume that there are signals A and B in Ressmeyer that control the condition of switches 322 and 323 in his FIGS. 3 and 6. If A is true then switch 322 is thrown to connect resistor 327 to the −12 V reference 321. In like fashion, if B is true then switch 323 is thrown to connect resistor 328 to the −12 V reference 327. At the end of this paragraph there is a truth table describing how the signals A and B are combined with another signal $SNE_n$ to produce control signals $A_1$, $A_2$, $B_1$ and $B_2$. "A" corresponds to switch 322 in Ressmeyer, while "B" corresponds to switch 323 in Ressmeyer. "$SNE_n$" stands for Switching Network Enable for switching network #n. These latter signals control the state of FET switches of the same names in our FIG. 1, and are produced as "break before make" signals with the logic circuit arrangement shown in our FIG. 2.

$$A_1 = A \cdot SNE_n$$
$$A_2 = \overline{A} \cdot SNE_n$$
$$B_1 = B \cdot SNE_n$$
$$B_2 = \overline{B} \cdot SNE_n$$

Figure 2:
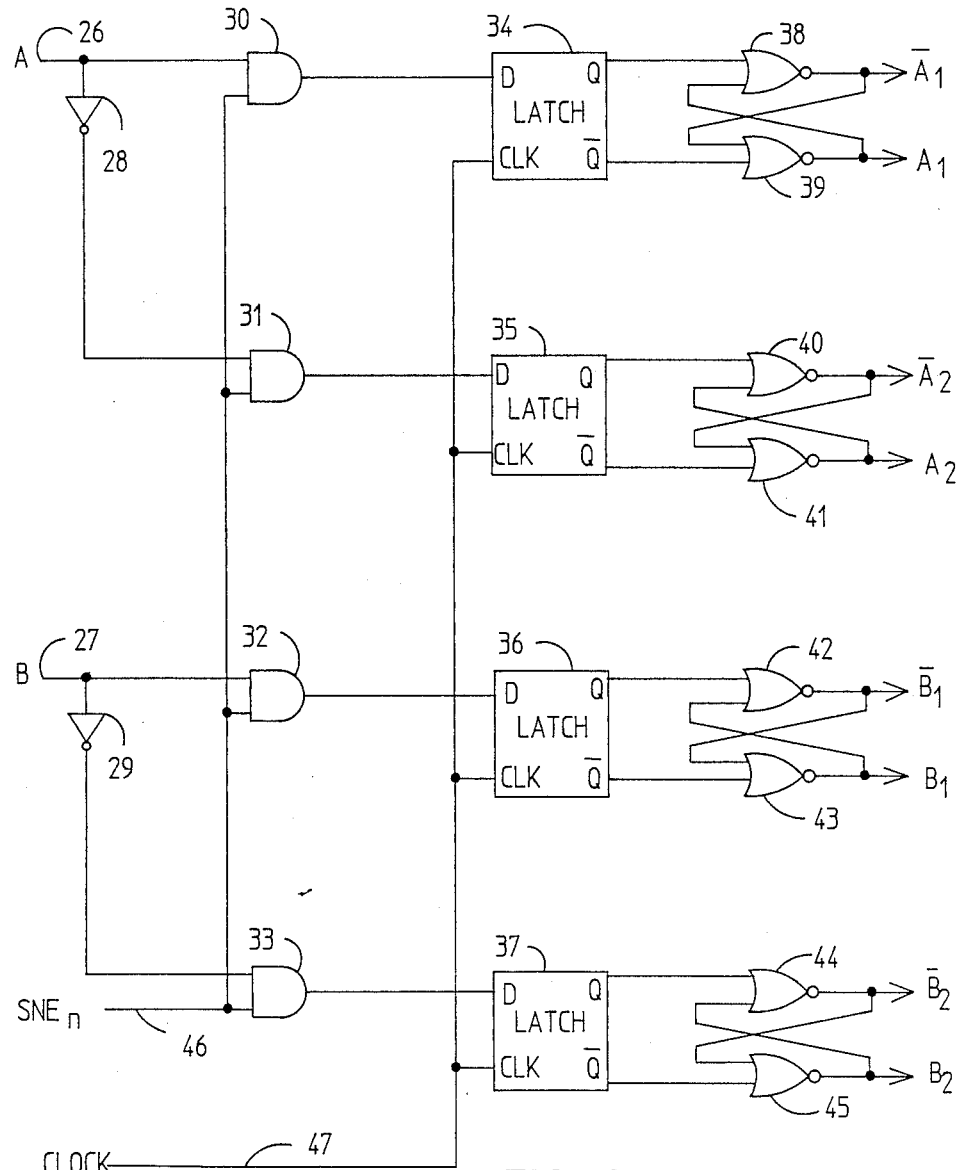
FIG. 2 is a schematic diagram of a gating circuit used in conjunction with the switching network of FIG. 1.

Referring briefly to our FIG. 2, signals A 26 and B 27 (which originate in the control mechanisms of Ressmeyer's FIG. 3) are converted into control signals $A_1$ through $B_2$ (and their complements) as follows. Consider signal A 26. It is applied to an AND gate 30 and to an inverter 28 to form its complement. The complement is applied to another AND gate 31. Each of AND gates 30 and 31 is enabled by the signal $SNE_n$ 46. Thus, the outputs of AND gates 30 and 31 are disabled whenever the associated switching network is disconnected, as explained below. The output from each AND gate is coupled to the D input of an associated D-type latch (34, 45). These latches are clocked by a signal CLOCK 47. The output of each latch is a complementary signal pair from the Q and NOT Q outputs. The pair of complementary outputs from latch 34 represents signal A and is coupled to a pair of cross-coupled NOR gates 38, 39. In like fashion, the complementary pair of outputs from latch 35 (representing the complement of signal A) is coupled to a pair of cross-coupled NOR gates 40, 41. With regard to the outputs from the pairs of cross-coupled NOR gates, a moment's reflection will satisfy the reader that the cross coupling acts to require that both output signals momentarily be false before the outputs can assume their complementary values. This establishes the "break before make" behavior mentioned earlier. The same applies to output from cross-coupled NOR gates 40 and 41. A similar analysis applies to the remaining circuitry in the figure, which produces control signals $B_1$, $B_2$ and their complements from signal B 27.

Resuming now the discussion of our FIG. 1, when one of the control signals $A_1$ through $B_2$ is true then its associated switch is on. That is, when $A_1$ is true switch 12 is on. The signal $SNE_n$ is an enable signal, standing for Switch Network Enable #n. There is more than one switching network that is capable of switching current into or out of the summing node 25 (although only one such network 24 is shown), and each of these can be "disconnected" by setting its associated $SNE_n$ signal false. In the case of switching network 24 in our FIG. 1, what that does is to force FET switches 12, 15, 18 and 21 to be off. On the other hand, to use switching network 24 its associated $SNE_n$ signal would be true, which allows the values of $A_1$, $A_2$, $B_1$ and $B_2$ (both the control signals and their associated FET switches) to be controlled by the signals A and B. Also, it will be understood that FET switches 4 and 5 in our FIG. 1 are controlled in a way that corresponds to the operation of switch 32 in Ressmeyer.

Very simply put, to charge our integrator 6 from $-V_{ref}$ 10 switches 12, 15, 19 and 22 are turned on, while 13, 16, 18 and 21 are off. $R_1$ and $R_2$ are thus placed in parallel from $-V_{ref}$ 10 to the summing node 25, while $R_3$ and $R_4$ are each disconnected therefrom, their current flowing instead into ground through switches 19 and 22. This corresponds to both signals A and B being true, which in turn corresponds to both switches 322 and 323 in Ressmeyer being connected to the $-12$ V reference 321. To charge the integrator 6 from $+V_{ref}$ 11 all the off switches are set to on and the on switches set to off. The two kinds of zero current are produced as follows. To produce $I_{+0}$ and $I_{-0}$ it is merely necessary to enter with A=true and B=false, or A=false and B=true, as appropriate. What this does is to form a voltage divider between $R_1$ and $R_4$, or between $R_2$ and $R_3$. The midpoint of the divider is (supposedly) at the same voltage as the summing node, and therefore contributes zero current thereto. Inserting alternate $I_{+0}$ and $I_{-0}$ conditions between instances of run-up current is part of the error reduction mechanism for switching imperfections taught in Ressmeyer.

A number of advantages obtain from the use of the summing node switching network 24 of our FIG. 1 in place of the reference voltage switching network 35 in Ressmeyer. While not necessarily listed in order of importance, these advantages include those set out in the paragraphs below.

First, the switches within the switching network 24 of our FIG. 1 need only withstand a very low voltage, since the voltage at the junction of each pair of switches (which we may call a "switching node") is never higher than the drop across a turned on switch plus the integrator offset voltage. (The stray capacitance at the switching node, in conjunction with the resistors $R_1$ through $R_4$, keeps the voltage from rising appreciably during the very brief interval while both switches are off as a consequence of break before make.) With reference voltage switching the switches need to be able to withstand the entire reference voltage.

Second, because the integrator summing node voltage is very nearly the same as ground (it is a *virtual ground*, after all), and because each of $R_1$ through $R_4$ is always carrying current, the reference supplies see almost no change in load current as the current paths for the resistors are switched. This reduces perturbations in the reference voltages, thus reducing settling time and allowing the entire analog-to-digital conversion process to run faster. With reference voltage switching *there are significant changes* in the load seen by the negative reference supply.

Third, because each resistor is always carrying current, changes in resistor value owing to variations in self-heating are eliminated; the self-heating is now constant throughout the entire use of the switching circuit, even including when it is disconnected from the summing node. The degree of self-heating in the resistors is not constant with reference voltage switching, since the current through the resistors varies, and does not remain constant.

Fourth, the sample and hold circuit of Ressmeyer can be eliminated. Its principal use in reference voltage switching is to adjust the offset voltage on the summing node to achieve a net contributed current to zero to the summing node from the run-up mechanism while the relatively small currents of run-down are used to exhaust the remaining charge on the integrator. Unless this is done a non-zero net contributed current from the run-up mechanism can interfere with any semblance of an accurate run-down. Because the switching network can easily be disconnected in summing node switching this difficulty does not arise. Hence, the sample and hold circuit can be eliminated, and yet even the smallest currents used in run-down are unaffected by the run-down mechanism.

Fifth, the ability to disconnect the switching network means that multiple run-up mechanisms can exist on the summing node without perverse interaction. This allows a greater flexibility in selecting speed/noise/resolution trade-offs than is possible with reference voltage switching, which cannot disconnect a switching network.

Sixth, summing node switching is not susceptible to an error mechanism that we may call "charge creep" during run-up. Charge creep arises because of asymmetries in the way the switching network generates a pulse of current to flow into the summing node. Referring again to FIG. 6 in Ressmeyer, as soon as switch 323 connects to the $-12$ V reference 321, a stray capacitance (not shown) at the junction of the switch 323 and resistor 328 begin to charge. It charges through the one resistance of the switch, which is not constant with temperature. Because of the on resistance of the switch being non-zero, the time required to charge the stray capacitance represents time during which the current through resistor 328 is not as great as it should be. Call this effect "shortage."

When switch 323 is thrown back to its other position (ground) the stray capacitance is shorted out through the on resistance of that path of the switch. The discharge is not immediate, and a little extra current flow through resistor 328 until the stray capacitance is discharged. Call this effect "surplus."

Now, the shortage in current at the beginning a run-up current pulse is generally not exactly cancelled by the surplus at the end. Furthermore, the effect varies with temperature. Add to this the fact that switch 322 has the same inexact mechanism, and it becomes possible for charge to slowly accumulate in the integrator simply because of these asymmetries in the run-up switching mechanism, even though there might be no voltage is being applied to the input resistor 33. To overcome this it is customary to make every measurement be the differential outcome of two measurements. The first is "measure zero," where the input is removed and the contribution by charge creep to a known voltage (i.e., zero) is determined. Then the voltage to be measured is applied, with the assumption that for two consecutive measurements the error owing to charge creep will be the same. This method of compensation works, but at the price of cutting the speed of system operation at least in half.

Summing node switching substantially reduces charge creep. Referring now to our FIG. 1, note that the only time the stray capacitance at the switching node (junction) of a pair of switches, say, of 13 and 14, can charge toward the reference voltage is when both are off. But that is a only very brief time related to the propagation time through the NOR gates of the break-before-make circuitry in our FIG. 2. Even if it does acquire some extra charge, it is immediately discharged back down to the nominal voltage on the switching node. For the transition occurring when switch 13 turns off and switch 12 turns on, this means that the stray capacitance at the switching node acts as a temporary repository of charge properly destined for the summing node, which is where that extra charge then goes as soon as switch 12 turns on. That is, the effective charge into the summing node begins when switch 13 turns off; *there is no "shortage."* Note that the pulse of current into the summing node ends when switch 12 turns off; a charged stray capacitance *does not contribute a "surplus."*

In the summing node switching arrangement of our FIG. 1 the length of the current pulse through resistor $R_1$ 14 is effectively determined only by the time between when switch 13 turns off and the time switch 12 turns off. The on resistances of the switches do not form meddlesome time constants with the stray capacitance at the switching node. Furthermore, the charge on that stray capacitance sees very little change. Hence, it is possible to offer the user of the analog-to-digital converter the option of eliminating the measure zero cycle without incurring a substantial penalty in performance. This allows faster measurements than are possible with reference voltage switching, which cannot eliminate the measure zero cycle without the introduction of substantial errors arising from charge creep.

A seventh advantage concerns the signal to noise ratio of the analog-to-digital converter. The summing node switching network 24 of our FIG. 1 presents a greater resistance for noise currents to the integrator's summing node than does the reference voltage switching network 35 of Ressmeyer's FIG. 3 or 35' of his FIG. 6. For a given amount of current during run-up, our circuit has twice the resistance to noise currents than has Ressmeyer's circuit. To fully appreciate this advantage we need to examine two topics. First we shall explain why the resistance of the switching network has an effect on the noise of the integrator. Then we shall point out why our summing node switching network has twice the noise current resistance of Ressmeyer's reference voltage switching network.

To appreciate why the resistance of the switching network influences the noise of the integrator, refer to our FIG. 1 and assume that the operational amplifier within the integrator itself is ideal and noiseless, and that there is a constant voltage noise source between the minus input terminal of the amplifier 7 and the end of the feedback capacitor $C_{int}$ 8 connected to the summing node 25. Next, note that if the effective resistance of the switching network were replaced by a resistor from the summing node to ground, then a noise current would flow in that resistance, as determined by the noise voltage and the sum of the amplifier input resistance and the effective resistance of the switching network. Note that increasing either resistance decreases the noise current, but that only the effective resistance of the switching network is under our practical control.

Next, note that with an actual switching network connected to the summing node the noise current flows through the resistors in the network, since it may be safely assumed that plus and minus reference supplies are good AC grounds. The noise current flowing in the resistors of the switching network modulates the current pulses supplied to the summing node. This is BAD, since it introduces uncertainty in the amount of charge applied to the integrator. Increasing the resistance of the switching network reduces the noise current, and is therefore GOOD.

Now, assume for the sake of explanation that each of resistors 33, 319, 327 and 328 in Ressmeyer have a resistance of R. (Actually, they are not exactly equal, but they are close. The reason they are different has nothing to do with the noise explanation being offered here.) Let there be an effective AC ground at the opposite end of each resistor from the summing node. (For the input registor this is provided by ground itself or by the low output impedance of an input buffer amplifier—not shown.) Now, resistors 319 and 33 are always in parallel to ground from the summing node 34. As far as the noise current is concerned, resistors 322 and 323 are also connected from the summing node to an AC ground, either directly or through the low impedance of the minus reference voltage 321. The equivalent very high DC resistance seen by the summing node because, say, switch 322 connects to the minus reference and switch 323 connects to ground (allowing resistor 328 to have "no" DC voltage across it, so that it "isn't there" for DC) must not be confused with the AC impedance presented to the summing node by the switching network and seen by the noise current: it is R/4.

In contrast, each of the four resistors $R_1$ through $R_4$ in our summing node is 2R in value. It is easy to see why this is so. $R_1$ and $R_2$ are used in parallel for a negative current pulse, while $R_3$ and $R_4$ are used in parallel for a positive current pulse. As far as the DC situation is concerned, the same value of R is needed for a given reference voltage to produce a given current into the summing node. The parallel combination of 2R and 2R is, of course, just R. But notice: at any given time only one of the parallel combinations of $R_1$ and $R_2$ or $R_3$ with $R_4$ is connected to the summing node! That contributes an R, which is then in parallel with the input resistor $R_{in}$ 33, to produce an effective resistance to the noise current of R/2. That is twice the resistance to the noise current of R/4 obtained by reference voltage switching.

Therefore, our arrangement has a much better signal to noise ratio for the integrator.

We claim:

1. An analog-to-digital converter comprising:
   an integrator having an input that is a summing node for currents and having an output;
   a source of input current to be measured, coupled to apply that input current to the summing node;
   a first constant current source generating a first current originating with a voltage negative with respect to a circuit ground;
   first switching means, coupled to the first current source, to the summing node, and to circuit ground, for routing the first current through the summing node or through circuit ground;
   a second constant current source generating a second current originating with a voltage negative with respective to circuit ground;
   second switching means, coupled to the second current source, to the summing node, and to circuit ground, for routing the second current through the summing node or through circuit ground;
   a third constant current source generating a third current originating with a voltage positive with respect to circuit ground;
   third switching means, coupled to the third current source, to the summing node, and to circuit ground, for routing the third current through the summing node or through circuit ground;
   a fourth constant current source generating a fourth current originating with a voltage positive with respect to circuit ground;
   fourth switching means, coupled to the fourth current source, to the summing node, and to circuit ground, for routing the fourth current through the summing node or through circuit ground; and
   control means, coupled to the first through fourth switching means, for selectively routing any selected pair of the first through fourth currents through the summing node, while routing the remaining pair of currents through circuit ground.

2. An analog-to-digital converter as in claim 1, wherein the control means is further for routing, at selected times, all of the first through fourth currents through circuit ground.

3. An analog-to-digital converter comprising:
   an integrator having an input that is a summing node for currents and having an output;
   a source of input current to be measured, coupled to apply that input current to the summing node;
   a first constant current source generating a first current having a first magnitude and originating with a voltage negative with respect to a circuit ground;
   first switching means, coupled to the first current source, to the summing node, and to circuit ground, for routing the first current through the summing node or through circuit ground;
   a second constant current source generating a second current having a second magnitude equal to the first magnitude and originating with a voltage negative with respect to circuit ground;
   second switching means, coupled to the second current source, to the summing node, and to circuit ground, for routing the second current through the summing node or through circuit ground;
   a third constant current source generating a third current having a third magnitude equal to the first magnitude and originating with a voltage positive with respect to circuit ground;
   third switching means, coupled to the third current source, to the summing node, and to circuit ground, for routing the third current through the summing node or through circuit ground;
   a fourth constant current source generating a fourth current having a fourth magnitude equal to the first magnitude and originating with a voltage positive with respect to circuit ground;
   fourth switching means, coupled to the fourth current source, to the summing node, and to circuit ground, for routing the fourth current through the summing node or through circuit ground; and
   control means, coupled to the first through fourth switching means, for selectively routing any selected pair of the first through fourth currents through the summing node, while routing the remaining pair of currents through circuit ground.

4. An analog-to-digital converter as in claim 3, wherein the control means is further for routing, at selected times, all of the first through fourth currents through circuit ground.

5. An analog-to-digital converter comprising:
   an integrator having an input that is a summing node for currents and having an output;
   a source of input current to be measured, coupled to apply that input current to the summing node;
   a first constant current source generating a first current having a first magnitude and originating with a voltage negative with respeect to a circuit ground;
   first switching means, coupled to the first current source, to the summing node, and to circuit ground, for routing the first current through the summing node or through circuit ground;
   a second constant current source generating a second current having a second magnitude equal to the first magnitude and originating with a voltage negative with respect to circuit ground;
   second switching means, coupled to the second current source, to the summing node, and to circuit ground, for routing the second current through the summing node or through circuit ground;
   a third constant current source generating a third current having a third magnitude equal to the first magnitude and originating with a voltage positive with respect to circuit ground;
   third switching means, coupled to the third current source, to the summing node, and to circuit ground, for routing the third current through the summing node or through circuit ground;
   a fourth constant current source generating a fourth current having a fourth magnitude equal to the first magnitude and orginating with a voltage positive with respect to circuit ground;
   fourth switching means, coupled to the fourth current source, to the summing node, and to circuit ground, for routing the fourth current through the summing node or through circuit ground;
   a fifth constant current source generating a fifth current having a fifth magnitude and originating with a voltage negative with respect to circuit ground;
   fifth switching means, coupled to the fifth current source, to the summing node, and to circuit ground, for routing the fifth current through the summing node or through circuit ground;

a sixth constant current source generating a sixth current having a sixth magnitude equal to the fifth magnitude and orginating with a voltage negative with respect to circuit ground;

sixth switching means, coupled to the sixth current source, to the summing node, and to circuit ground, for routing the sixth current through the summing node or through circuit ground;

a seventh constant current source generating a seventh current having a seventh magnitude equal to the fifth magnitude and originating with a voltage positive with respect to circuit ground;

seventh switching means, coupled to the seventh current source, to the summing node, and to circuit ground, for routing the seventh current through the summing node or through circuit ground;

an eighth constant current source generating an eighth current having an eighth magnitude equal to the fifth magnitude and originating with a voltage positive with respect to circuit ground;

eighth switching means, coupled to the eighth current source, to the summing node, and to circuit ground, for routing the eighth current through the summing node or through circuit ground; and control means, coupled to the first through eighth switching means, for at first times selectively routing any selected pair of the first through fourth currents through the summing node, while routing the remaining pair of first through fourth currents through circuit ground, and for at second times selectively routing any selected pair of the fifth through eighth currents into the summing node, while routing the remaining pair of fifth through eighth currents through circuit ground.

6. An analog-to-digital converter as in claim 5 wherein the first and second times occur disjointly.

7. An analog-to-digital converter as in claim 5 wherein the first and second times occur simultaneously.

8. An analog-to-digital converter as in claim 5, wherein the fifth magnitude is a fraction of the first magnitude and wherein the control means is further for routing, at selected third times, all of the first through fourth currents through circuit ground, and also for routing, at selected fourth times, all of the fifth through eighth currents through circuit ground.

9. An analog-to-digital converter as in claim 8 wherein the third and fourth times occur disjointly.

10. An analog-to-digital converter as in claim 8 wherein the third and fourth times occur simultaneously.

* * * * *